United States Patent [19]

Izawa

[11] Patent Number: 5,250,835
[45] Date of Patent: Oct. 5, 1993

[54] FIELD EFFECT TYPE THIN FILM TRANSISTOR HAVING A PLURALITY OF GATE ELECTRODES

[75] Inventor: Mitsuharu Izawa, Tokyo, Japan
[73] Assignee: Casio Computer Co., Ltd., Tokyo, Japan
[21] Appl. No.: 812,578
[22] Filed: Dec. 20, 1991
[30] Foreign Application Priority Data

Jan. 16, 1991 [JP] Japan ............................ 3-3501

[51] Int. Cl.⁵ .................... H01L 29/76; H01L 29/04; H01L 29/94; H01L 31/062
[52] U.S. Cl. ............................. 257/408; 257/66; 257/344; 257/365; 257/369
[58] Field of Search .............. 357/23.1, 23.3, 23.7, 357/23.14, 41; 257/344, 408, 365, 66, 369

[56] References Cited

U.S. PATENT DOCUMENTS

| | | | |
|---|---|---|---|
| 3,657,614 | 4/1972 | Cricchi | 357/23.14 |
| 4,697,333 | 10/1987 | Nakahara | 357/23.3 |
| 4,907,041 | 3/1990 | Huang | 357/23.14 |
| 5,124,769 | 6/1992 | Tanaka et al. | 357/23.7 |
| 5,151,759 | 9/1992 | Vinal | 357/23.14 |

FOREIGN PATENT DOCUMENTS

| | | | |
|---|---|---|---|
| 58-87875 | 5/1983 | Japan | 357/23.14 |
| 63-204769 | 8/1988 | Japan | 357/23.7 |
| 1-158775 | 6/1989 | Japan | 357/23.7 |
| 2-20060 | 1/1990 | Japan | 357/23.7 |
| 2-27772 | 1/1990 | Japan | 357/23.7 |
| 2-159767 | 6/1990 | Japan | 357/23.7 |

OTHER PUBLICATIONS

IEEE Transactions on Electron Devices, vol. 38, No. 1, Jan. 1991, "A High-Voltage Polysilicon TFT with Multigate Structures" by Uemoto et al. pp. 95-99.

*Primary Examiner*—Rolf Hille
*Assistant Examiner*—Steven Loke
*Attorney, Agent, or Firm*—Frishauf, Holtz, Goodman & Woodward

[57] ABSTRACT

A thin film transistor includes a gate insulating film, a plurality of gate electrodes arranged on one surface of the gate insulating film, and a thin film semiconductor island formed on the other surface of the gate insulating film and having portions each corresponding to one of the gate electrodes. The island includes a source region in which ion impurities are diffused at high density and located at one end of the island, a drain region in which ion impurities are diffused at high density and located at the other end of the island, a first low impurity region in which ion impurities are diffused at lower density than that of the drain region and located between the drain region and one of the portions adjacent to the drain region, and a second low impurity region in which ion impurities are diffused at lower density than that of the drain region and located between at least one of the portions.

10 Claims, 2 Drawing Sheets

FIELD EFFECT TYPE THIN FILM TRANSISTOR HAVING A PLURALITY OF GATE ELECTRODES

BACKGROUND OF THE INVENTION

1. Field of the Invention

The present invention relates to a field effect type thin film transistor having a plurality of gate electrodes arranged between source and drain regions.

2. Description of the Related Art

In a conventional field effect type transistor, if source and drain regions, both formed by diffusing impurities in a semiconductor layer at a high concentration, are brought into direct surface contact with a channel region, a depletion layer, occurred at a boundary surface between the drain and channel regions with an application of a high voltage, becomes so large thereby easily causing an avalanche phenomenon, in which electrons are excited and induce pairs of activated electrons and positive holes. Some of the high-energy hot electrons thus dashed into a gate insulation film, and are caught therein. Due to the behavior of the hot electrons, problems such as variations in threshold voltage and mutual conductance, or lowering of withstand voltage, occur.

As a counterplan to such problems, a structure of interposing a buffer region, in which impurities are diffused at a low concentration, between the drain and source regions of the semiconductor layer is well known. This structure is called as "Lightly Doped Drain" (LDD), and U.S. Pat. No. 4,697,333 discloses an example of the LDD structure. This prior art document discloses a construction for making a single N-MOS by using a monocrystalline semiconductor substrate.

In the meantime, recently, the development of a field effect transistor using a thin film semiconductor layer is actively conducted. The TFT of this type enables realization of new devices such as liquid crystal display panels and large capacity memory devices, which have not been realized with silicon semiconductor substrates. These TFTs require, in addition to a single-transistor element such as N-MOS type and P-MOS type, a circuit in which a plurality of gate electrodes are formed in one semiconductor island, such as an AND circuit, a NAND circuit, a OR circuit, a NOR circuit, and a clocked inverter circuit. In this case, since a thin film transistor is significantly different from a monocrystalline transistor in characteristics of a leak current, an on current, and a withstand voltage, the thin film transistor having the same construction as that of the monocrystalline transistor is not considered to be putted to practical use. However, a construction of the above described circuit appropriate for a thin film transistor has not yet been examined.

SUMMARY OF THE INVENTION

Thus, the object of this invention is to provide a field effect type thin film transistor which has a plurality of gate electrodes in a single semiconductor island, and is most appropriated to a withstand voltage, an off-current, and an on-current.

According to the present invention, a film transistor comprising a gate insulating film having one surface and the other surface, a plurality of gate electrodes arranged on the one surface of the gate insulating film, and a film semiconductor island formed on the other surface of the gate insulating film and having portions each corresponding to one of the gate electrodes. The island includes a source region in which ion impurities are diffused at high density and located at one end of the island, a drain region in which ion impurities are diffused at high density and located at the other end of the island, a first low impurity region in which ion impurities are diffused at lower density than that of the drain region and located between the region and one of the portions adjacent to the drain region, and a second low impurity region in which ion impurities are diffused at lower density than that of the drain region and located between at least one of the portions.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE PREFERRED EMBODIMENTS

Figure 1:
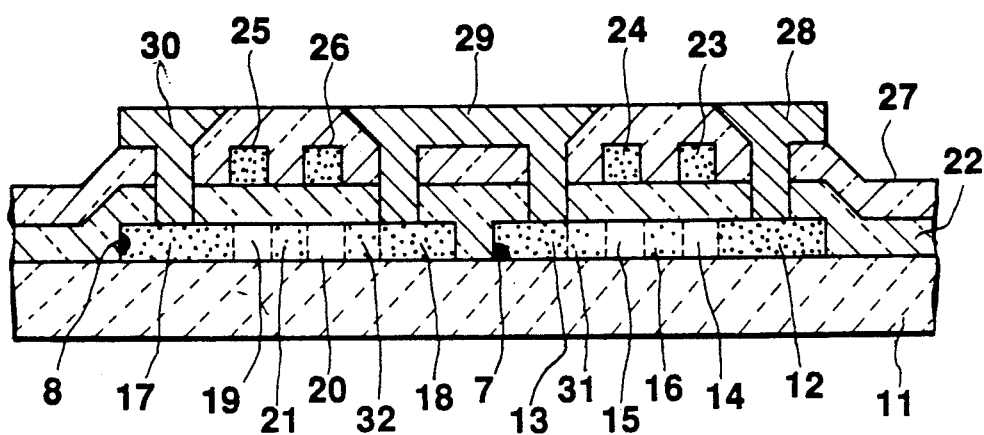
FIG. 1A is an enlarged cross sectional view of a clocked inverter as a first embodiment according to a field effect type thin film transistor of the present invention.
FIG. 1B is a circuit diagram of FIG. 1A.
Figure 1:
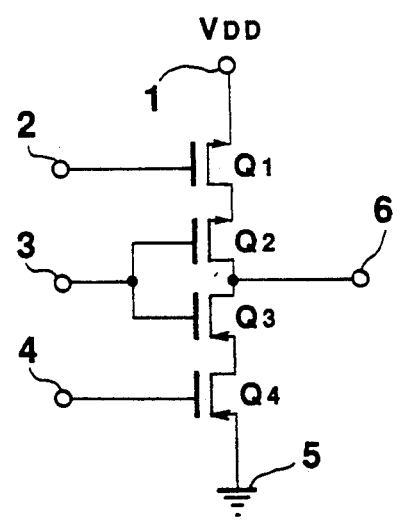

FIG. 1A is an enlarged cross sectional view of a clocked inverter, which is a first embodiment of a field effect type thin film transistor according to the present invention. A couple of semiconductor islands 7 and 8 are formed of polysilicon or amorphous silicon on an insulation substrate 11 such as a glass substrate. At both ends of the semiconductor island 7, n+-high-concentration source and drain regions 12 and 13 are formed, into which a great deal of donor impurities such as phosphorus and the like are diffused. This semiconductor island 7 has channel regions 14 and 15 between the source and drain regions 12 and 13. Further, an n--low concentration field buffer region 31 is formed between the drain region 13 and the channel region 15. A region between the channel regions 14 and 15 in the semiconductor island 7 is an n--low concentration region 16 having substantially the same concentration as that of the field buffer region 31.

At both ends of the semiconductor island 8, p+-high-concentration source and drain regions 17 and 18 are formed, into which a great deal of acceptor impurities such as boron and the like are diffused. This semiconductor island 8 has channel regions 19 and 20 between the source and drain regions 17 and 18.

Further, a p--low-concentration field buffer region 32 is formed between the drain region 18 and the channel region 20 in the semiconductor island 8. A region between the channel regions 19 and 20 in the semiconductor island 8 is an p⁻-low-concentration region 21 having substantially the same concentration as that of the field buffer region 32.

A gate insulation film 22 is formed by such as silicon oxide or silicon nitride on each of the semiconductor islands 7, 8 and the insulation substrate. At positions on the gate insulation film which are corresponding to the channel regions 14, 15, 19 and 20, gate electrodes 23, 24, 25, and 26 are formed. These gate electrodes 23 to 26 are made of polysilicon in which impurities are diffused, or of a conductive metal such as aluminum or chrome. In order to form the above-mentioned regions 14 to 21 a self-aligning method, in which ions are implanted using the gate electrodes 23 to 26 as masks after completion of the great electrodes 23 to 26, is efficient.

The upper surfaces of the gate insulation film 22 and the gate electrodes 23 to 26 are covered by a passivation film 27 made of such as silicon oxide or silicon nitride. Through-holes are formed in portions of the gate insulation film 22 and of the passivation film 27 corresponding to the regions 12, 13, 17 and 18, and in these through-holes, source electrodes 28, 30 and a drain electrode 29 for connecting the n⁺-high-concentration drain region 13 and the p⁺-high-concentration drain region 18 with each other are formed by metal such as aluminum or chrome.

FIG. 1B shows a circuit diagram of the clocked inverter shown in FIG. 1A. The circuit is well-known. A P-MOS FETQ2 and an N-MOS FETQ3 constitute a C-MOS FET. A P-MOS FETQ1 is connected between a power source terminal 1, to which power voltage $V_{DD}$ is applied, and the FETQ2, and an N-MOS FETQ4 is connected between a ground 5 and the FETQ3. When a high electric potential is applied to an input terminal 4 to turn on the FETQ4 in a case that a high electric potential is applied to an input terminal 3 so that the FETQ2 is turned off and the FETQ3 is turned on, a ground electric potential is obtained at an output terminal 6. While a low electric potential is being applied to the input terminal 4, a floating state is set. When a low electric potential is applied to the input terminal 2 to turn on the FETQ1, in a case that a low electric potential is applied to the input terminal 3 so that the FETQ3 is turned off and the FETQ2 is turned on, a power source voltage $V_{DD}$ is obtained at the output terminal 6. While a high electric potential is being applied to the input terminal 2, the floating state is set.

In the thin film transistor having the structure shown in FIG. 1A, the N-MOS FETQ3 is high in the withstand voltage because it has the field buffer region 31 between the drain and channel regions 13 and 15. The P-MOS FETQ2 is high in the withstand voltage because it has the field buffer region 32 between the drain and channel regions 18 and 20. Further, a portion between the gate electrode 24 of the N-MOS FETQ3 and that of the N-MOS FETQ4 is good in characteristics of both the ON current and OFF (leak) current because that portion is the n⁻-low-concentration region 16 having substantially the same concentration as that of the field buffer region 31. If the region 16 has a high concentration, the OFF current becomes large, and if the region 16 is made to have the LDD structure with the high and low impurity concentration regions the ON current becomes small. Thus, both cases include problems. A portion between the gate electrode 26 of the P-MOS FETQ2 and that 25 of the P-MOS FETQ1 is good in characteristics of both the ON current and OFF (leak) current because that portion is the p⁻-low-concentration region 21 having substantially the same concentration as that of the field buffer region 32. If the region 21 has a high concentration, the OFF current becomes large, and if the region 21 is made to have the LDD structure with the high and low impurity concentration regions the ON current becomes small. Again, both cases include problems.

The embodiment shown in FIG. 1A is the C-MOS FET type clocked inverter. In the embodiment, it is clear that the present invention is also applicable to an FET having a structure in which drain regions 13 and 18 are not connected. That is, the present invention can be conducted as described above in a P-MOSFET type clocked inverter only consisting of P-MOS FETQ1 and Q2, and N-MOSFET type clocked inverter only consisting of N-MOS FETQ3 and FETQ4.

Figure 2:
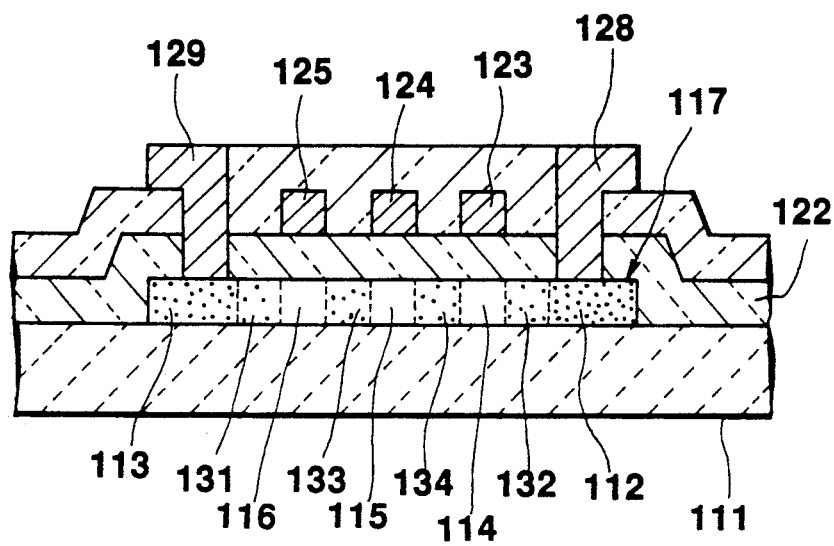
FIG. 2A is an enlarged cross sectional view of an NAND circuit or a NOR circuit as a second embodiment according to the present invention.
FIGS. 2B and 2C are circuit diagrams of the NAND circuit and the NOR circuit, respectively.
Figure 2:
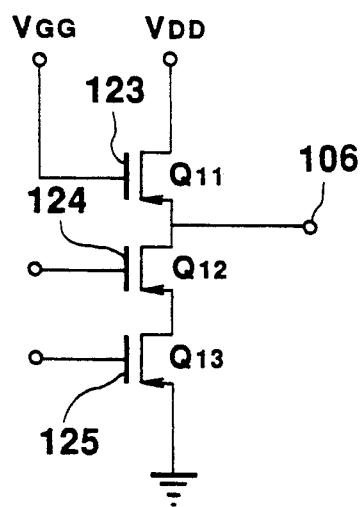
Figure 2:
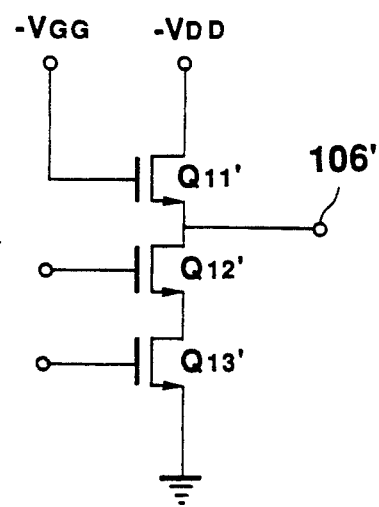

Further, the thin film transistor of the invention is applicable to not only the inverter circuit but also a NAND circuit and a NOR circuit. FIG. 2A shows such embodiment. High-concentration regions 112 and 113, which become source and drain regions, are formed at both end sides of a semiconductor island 117 formed on an insulation substrate 111. Three channel regions 114, 115 and 116 are formed between the high-concentration regions 112 and 113 on the semiconductor island 117. A low-concentration region 132 is formed between the high-concentration region 112 and the channel region 114, a low-concentration region 131 is formed between the high-concentration region 113 and the channel region 116, a low-concentration region 134 is formed between the channel regions 114 and 115, and a low-concentration region 133 is formed between the channel regions 115 and 116. The low-concentration regions 131 to 134 have concentrations lower than those of the high-concentration regions 112 and 113, and the impurities are diffused in all the regions 131 to 134 at substantially the same concentration.

FIGS. 2B and 2C show NAND and NOR circuits, respectively. If the high-concentration regions 112 and 113 of the thin film transistor shown in FIG. 2A are n⁺-diffusion regions and the low-concentration regions 131 to 134 thereof are n⁻-diffusion regions, it forms the NAND circuit shown in FIG. 2B. If the high-concentration regions 112 and 113 of the thin film transistor shown in FIG. 2A are p⁺-diffusion regions and the low-concentration regions 131 to 134 thereof are p⁻-diffusion regions, it forms the NOR circuit shown in FIG. 2C. The action of the NAND circuit is well-known. In the NAND circuit, only when a high electric potential is applied to the gate electrodes of the N-MOS FETQ12 and Q13 to set the N-MOS FETQ12 and Q13 in an on-state in a case that no high electric potential $V_{GG}$ is supplied to the gate electrode of the N-MOS FETQ11 so that the N-MOS FETQ11 is set in an off-state, a ground electric potential is outputted to an output terminal 106. The action of the NOR circuit is also well-known. In the NOR circuit, only when a low electric potential such as $-V_{GG}$ is applied to the gate electrodes of the P-MOS FETQ12' and Q13' to set the P-MOS FETQ12' and Q13' in an on-state in a case that no low electric potential $-V_{GG}$ is supplied to the gate electrode of the P-MOS FETQ11' so that the P-MOS FETQ11' is set in an off-state, a ground electric potential (at high level) is obtained at an output terminal 106'.

The above-mentioned NAND and NOR circuits are designed to meet the case of two input signals, and have three gate electrodes. However, it is obvious that the present invention can be applied to the case of much more input signals. Further, the above-described embodiments show a coplanar type construction. However, not only a reverse coplanar type, but also a stagger and reverse-stagger types can be employed. The thin film transistor circuit of the invention is applicable to other circuits which are not disclosed in the embodiments.

Additional advantages and modifications will readily occur to those skilled in the art. Therefore, the invention in its broader aspects is not limited to the specific details, and representative devices, shown and described herein. Accordingly, various modifications may be made without departing from the spirit or scope of the general inventive concept as defined by the appended claims and their equivalents.

What is claimed is:

1. A thin film semiconductor device having a plurality of transistors comprising:
   a thin film semiconductor island having a first zone and a second zone, said first and second zones being contiguously formed;
   said island including:
      a source region in which ion impurities are diffused to have a high density, said source region being disposed at an end portion of said first zone of said island;
      a drain region in which ion impurities are diffused to have a high density, said drain region being disposed at an end portion of said second zone of said island;
      said source region being disposed on said island at a side of said island that is opposite to said drain region;
      a first low impurity region in which ion impurities are diffused and have a density that is lower than said high density of said drain region, said first low impurity region being disposed adjacent to said drain region in said second zone of said island;
      a second low impurity region in which ion impurities are diffused to have a density that is lower than said high densities of said source and drain regions, said second low impurity region being disposed between said first low impurity regions and said source region;
      a first channel region provided between said second low impurity region and said source region in said first zone of said island; and
      a second channel region provided between said first and second low impurity regions in said second zone of said island;
   a gate insulating film formed on said island;
   a first gate electrode formed on said gate insulating film at a position on said first zone in said island that corresponds to a position of said first channel region in said island; and
   a second gate electrode formed on said gate insulating film at a position on said second zone in said island that corresponds to a position of said second channel region in said island; whereby: (A) said source region, said first channel region and said second low impurity region that are respectively provided in said first zone of said island, are operationally coupled with said first gate electrode, to form a first thin film transistor; and (B) said drain region, said first low impurity region, said second channel region and said second low impurity region that are respectively provided in said second zone of said island, are operationally coupled with said second gate electrode to form a second thin film transistor that is drivable when a gate voltage is applied to said second gate electrode independently of a driving of said first gate electrode of said first thin film transistor.

2. The thin film semiconductor device according to claim 1, wherein said first and second low impurity regions have ion impurity densities which are substantially equal to each other.

3. The thin film semiconductor device according to claim 1, wherein said thin film semiconductor island comprises polycrystalline silicon.

4. The thin film semiconductor device according to claim 1, wherein said thin film semiconductor device comprises a clocked inverter.

5. The thin film semiconductor device according to claim 1, wherein said thin film semiconductor device comprises an inverter.

6. A thin film semiconductor device having a plurality of transistors comprising:
   a thin film semiconductor island having a first zone, a second zone, and a third zone disposed between said first and second zones, said first, second and third zones being contiguously formed, on said island;
   said island including:
      a first high dopant region in which ion impurities are diffused to have a high density, said first high density dopant region being disposed at an end portion of said first zone of said island;
      a second high dopant region in which ion impurities are diffused to have a high density, said second high dopant region being disposed at an end portion of said second zone of said island;
      said first high dopant region being disposed, in said island at a side of said island that is opposite to said second high dopant region in said island;
      a first low dopant region in which ion impurities are diffused and have a density lower than said high density of said first high dopant region, said first low dopant region being disposed adjacent to said first high dopant region in said first zone of said island;
      a second low dopant region in which ion impurities are diffused to have a density lower than said high density of said second high dopant region, said second low dopant region being disposed adjacent to said second high dopant region in said second zone of said island;
      a third and fourth low dopant region in which ion impurities are respectively diffused to have a density lower than said densities of said first and second high dopant regions, said third and fourth low dopant regions being disposed between said first and second low dopant regions so as to be spaced apart from each other;
      a first channel region provided between said first and said third low dopant regions in said first zone of said island;
      a second channel region provided between said second and said fourth low dopant regions in said second zone of said island; and
      a third channel region provided between said third and said fourth low dopant regions in said third zone of said island;
   a gate insulating film formed on said island;

a first gate electrode formed on said gate insulating film at a position on said first zone in said island that corresponds to a position of said first channel region in said island;

a second gate electrode formed on said gate insulating film at a position on said second zone in said island that corresponds to said second channel region in said island; and a third gate electrode formed on said gate insulating film at a position on said third zone in said island that corresponds to a position of said third channel region, in said island; whereby: (A) said first high dopant region, said first channel region and said third low dopant region, said first gate electrode, and said third low dopant region together form a first thin film transistor; (B) said second high dopant region, said second channel region, said second low dopant region, said second gate electrode, and said fourth low dopant region together form a second thin film transistor; and (C) said third gate electrode, said third channel region, said third low dopant region, and said fourth low dopant region, together form a third thin film transistor which is drivable, when a gate voltage is applied to said third gate electrode, independently of a driving to said first and second gate electrodes of said first and second thin film transistors, respectively.

7. The thin film semiconductor device according to claim 6, wherein said first, second, third and fourth low dopant regions have ion impurity densities which are substantially equal to each other.

8. The thin film semiconductor device according to claim 6, wherein said thin film semiconductor island comprises polycrystalline silicon.

9. The thin film semiconductor device according to claim 6, wherein said thin film semiconductor device comprises a NAND circuit.

10. The thin film semiconductor device according to claim 6, wherein said thin film semiconductor device comprises a NOR circuit.

* * * * *